US010777457B2

(12) United States Patent
Tam

(10) Patent No.: US 10,777,457 B2
(45) Date of Patent: Sep. 15, 2020

(54) CARRIER SUBSTRATE, PACKAGE, AND METHOD OF MANUFACTURE

(71) Applicant: Ubotic Company Limited, Tsuen Wan, Hong Kong (CN)

(72) Inventor: Ming-Wa Tam, Hong Kong (CN)

(73) Assignee: UBOTIC COMPANY LIMITED, Tsuen Wan, Hong Kong (CN)

( * ) Notice: Subject to any disclaimer, the term of this patent is extended or adjusted under 35 U.S.C. 154(b) by 220 days.

(21) Appl. No.: 15/723,566

(22) Filed: Oct. 3, 2017

(65) Prior Publication Data

US 2019/0103313 A1    Apr. 4, 2019

(51) Int. Cl.
| H01L 21/768 | (2006.01) |
| H01L 23/31 | (2006.01) |
| H05K 3/42 | (2006.01) |
| H05K 1/11 | (2006.01) |
| H01L 23/13 | (2006.01) |
| H05K 3/02 | (2006.01) |
| H05K 3/10 | (2006.01) |
| H01L 23/495 | (2006.01) |
| H01L 23/498 | (2006.01) |

(52) U.S. Cl.
CPC ........ *H01L 21/76898* (2013.01); *H01L 23/13* (2013.01); *H01L 23/3114* (2013.01); *H01L 23/49541* (2013.01); *H01L 23/49861* (2013.01); *H05K 1/117* (2013.01); *H05K 3/022* (2013.01); *H05K 3/108* (2013.01); *H05K 3/427* (2013.01); *H01L 23/3107* (2013.01); *H01L 23/3121* (2013.01); *H01L 2224/48227* (2013.01); *H05K 2201/09554* (2013.01)

(58) Field of Classification Search
CPC . H01L 23/28; H01L 23/293; H01L 21/76898; H01L 2204/48227; H05K 3/30; H05K 3/34; H05K 2201/09554; H05K 1/117; H05K 3/022; H05K 3/108; H05K 3/427; H91L 23/13; H91L 23/3107; H91L 23/3114; H91L 23/3121; H91L 23/49541; H91L 23/49861
See application file for complete search history.

(56) References Cited

U.S. PATENT DOCUMENTS

| 5,086,018 | A | * | 2/1992 | Conru | ...................... | H01L 21/56 257/702 |
| 6,008,996 | A | * | 12/1999 | Schoenfeld | ......... | H01L 23/4951 257/666 |
| 6,706,971 | B2 | * | 3/2004 | Albert | ................. | H01L 23/3114 174/255 |
| 2008/0290484 | A1 | * | 11/2008 | Low | ...................... | H01L 21/565 257/675 |
| 2010/0052125 | A1 | * | 3/2010 | Sasaki | .................. | B23K 20/005 257/676 |

FOREIGN PATENT DOCUMENTS

WO    WO 2003005782 A2 *    1/2003

* cited by examiner

*Primary Examiner* — Carl J Arbes
(74) *Attorney, Agent, or Firm* — Keating and Bennett, LLP

(57) ABSTRACT

A method of manufacturing, a carrier, and a semiconductor package are provided. The method involves depositing a plurality of conductive vias, applying a molding material over the lead frame, grinding the molding material to expose the plurality of conductive vias, and depositing a metalized pattern over the molding material. The carrier is manufacture by this method and the semiconductor package is formed based on the carrier.

8 Claims, 11 Drawing Sheets

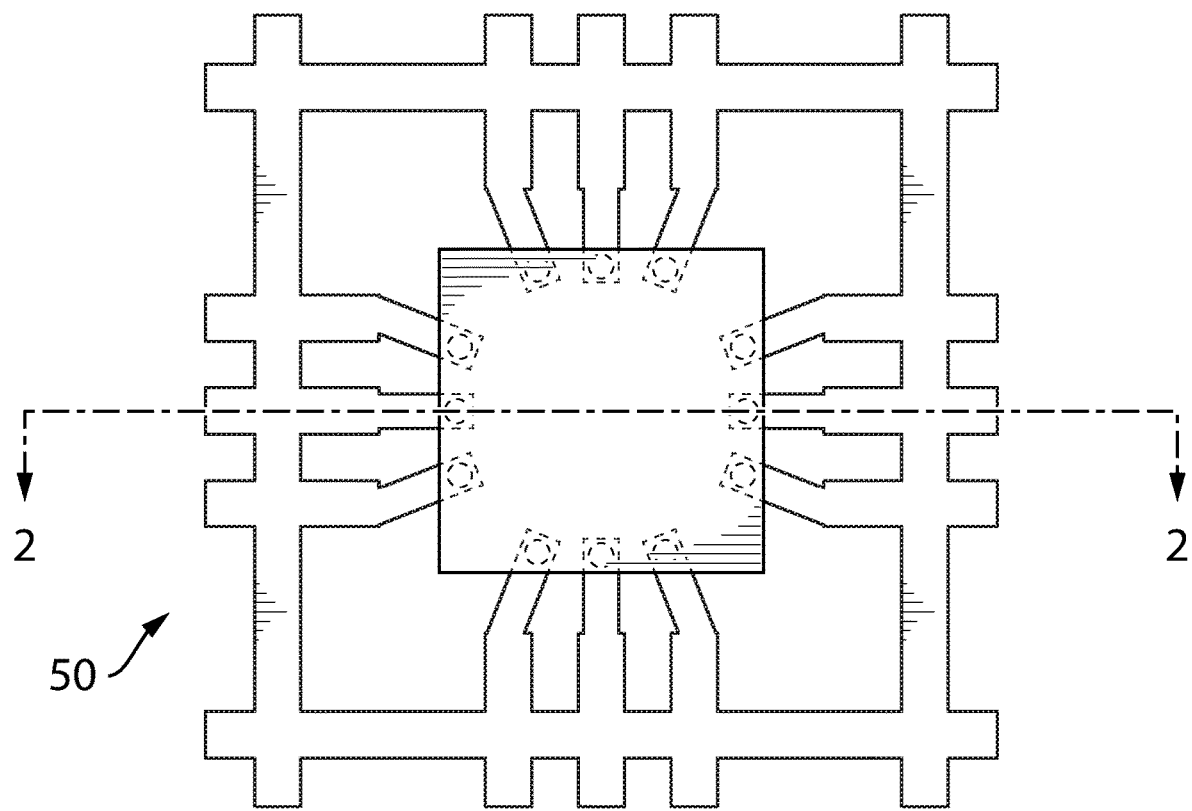
PRIOR ART  FIG. 2A
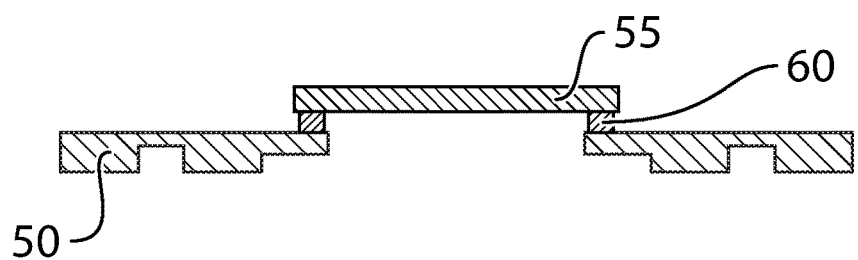
PRIOR ART  FIG. 2B

CARRIER SUBSTRATE, PACKAGE, AND METHOD OF MANUFACTURE

FIELD

The present invention relates generally to semiconductor packages, and more particularly to a carrier for semiconductor packages and a method of manufacture.

BACKGROUND

Semiconductor packages are known and are generally assembled onto a carrier structure along with several other semiconductor packages in close proximity. The carrier provides electrical interconnections and is generally manufactured from a lead frame formed using an etching process. As an example, flip chip (FC) quad flat no lead (QFN) packages can be assembled on carriers based on lead frames formed using an etching process. In such packages, routing capability from the chip to the carrier is not available and the inner lead pitch is limited by etching techniques.

FIGS. 1 to 3 illustrate a known method of assembling conventional flip chip quad flat no lead packages. FIGS. 1A and 1B illustrate a metal lead frame 50 having a lead structure for receiving a flip chip. As shown in FIGS. 2A and 2B, a flip chip 55 can be mounted on the lead frame 50 using solder 60 to connect contacts on the flip chip 55 with the lead frame 50. The flip chip 55 and the lead frame 50 are then encapsulated using a molding compound 65 as shown in FIGS. 3A and 3B. Since the lead frame 50 must make contact with the flip chip 55, the limitations of this package arise from the pitch of the lead frame 50 and the ability to fabricate a sufficiently small lead frame 50 while maintaining sufficient structural strength to avoid deformation and damage.

SUMMARY

In accordance with an aspect of the invention, there is provided a method of manufacturing a carrier. The method involves depositing a plurality of conductive vias on a top surface of a lead frame. In addition, the method involves applying a molding material over the lead frame, wherein the molding material covers the top surface of the lead frame and the plurality of conductive vias. The molding material exposes a bottom surface of the lead frame. The method further involves grinding the molding material to expose the plurality of conductive vias. Furthermore, the method involves depositing a metalized pattern over the molding material, wherein the metalized pattern is in electrical communication with the plurality of conductive vias.

The method may further involve etching the lead frame with dual rows of leads.

The lead frame may include a die attach pad.

The die attach pad may be connected to a tie bar.

The metalized pattern includes a ring to provide an additional ground path to the die attach pad.

The method may further involve depositing a seed layer on the molding material prior to depositing the metalized pattern.

The method may further involve etching the seed layer.

Etching the seed layer may involve using the metalized pattern as a mask.

The method may further involve depositing a fiducial mark for aligning a chip.

The method may further involve attaching a chip to the carrier using the fiducial mark.

The chip may be a flip chip.

The method may further involve applying an encapsulation polymer to protect the flip chip.

In accordance with another aspect of the invention, there is provided a substrate for receiving a chip. The substrate includes a lead frame having a top surface and a bottom surface. The substrate further includes a plurality of conductive vias deposited on the top surface of the lead frame. Also, the substrate includes a molding material applied over the lead frame, wherein the molding material covers the top surface of the lead frame and exposes the plurality of conductive vias. Furthermore, the substrate includes a metalized pattern deposited on the molding material. The metalized pattern is in electrical communication with the plurality of conductive vias.

The lead frame may include dual rows of leads.

The lead frame may include a die attach pad.

The die attach pad may be connected to a tie bar.

The substrate may further include a seed layer deposited on the molding material, wherein the metalized pattern deposited directly on the seed layer.

The substrate may further include a fiducial mark for aligning the chip.

In accordance with another aspect of the invention, there is a semiconductor package. The semiconductor package includes a lead frame having a top surface and a bottom surface, wherein the lead frame comprises dual rows of leads and a die attach pad. In addition, the semiconductor package includes a plurality of conductive vias deposited on the top surface of the lead frame. Furthermore, the semiconductor package includes a molding material applied over the lead frame. The molding material covers the top surface of the lead frame and exposes the plurality of conductive vias. Also, the semiconductor package includes a metalized pattern deposited on the molding material, wherein the metalized pattern is in electrical communication with the plurality of conductive vias. The semiconductor package further includes a flip chip attached to the metalized pattern, wherein connectors of the flip chip are in communication with the dual rows of leads and the die attach pad.

The semiconductor package may further include applying an encapsulation polymer to protect the flip chip.

BRIEF DESCRIPTION OF THE DRAWINGS

Reference will now be made, by way of example only, to the accompanying drawings in which:

FIG. 2A is a top perspective view of the lead frame of FIG. 1 and flip chip in accordance with the prior art embodiment;

FIG. 2B is a cross sectional view of the embodiment of FIG. 2A through the line 2-2;

DETAILED DESCRIPTION OF THE EMBODIMENTS

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

In describing the components of the carrier and alternative versions, or embodiments, of some of these components, the same reference number can be used for elements that are the same as, or similar to, elements described in other versions or embodiments. As used herein, any usage of terms that suggest an absolute orientation (e.g. "top", "bottom", "front", "back", etc.) are for illustrative convenience and refer to the orientation shown in a particular figure. However, such terms are not to be construed in a limiting sense as it is contemplated that various components will, in practice, be utilized in orientations that are the same as, or different than those described or shown.

Figure 1A:
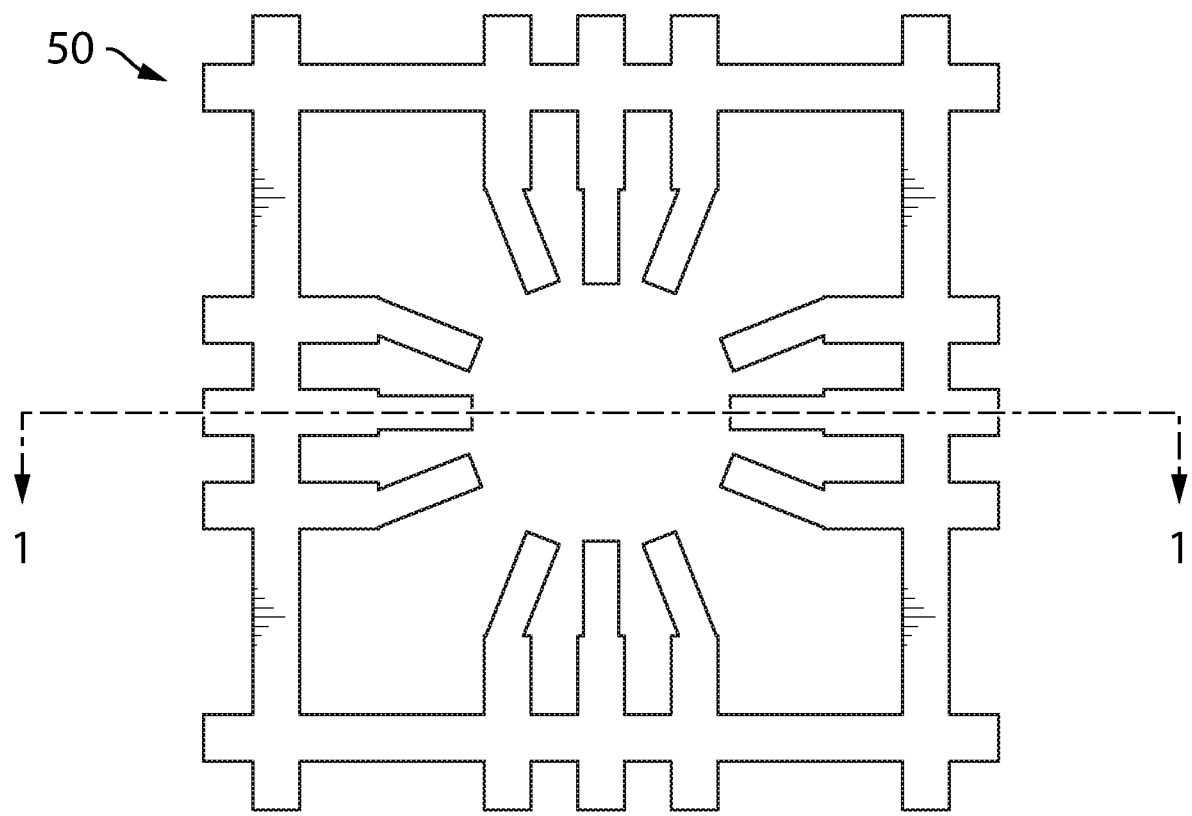
FIG. 1A is a top perspective view of a lead frame in accordance with a prior art embodiment.
Figure 1B:
FIG. 1B is a cross sectional view of the prior art lead frame in accordance with the embodiment of FIG. 1A through the line 1-1.
Figure 3A:
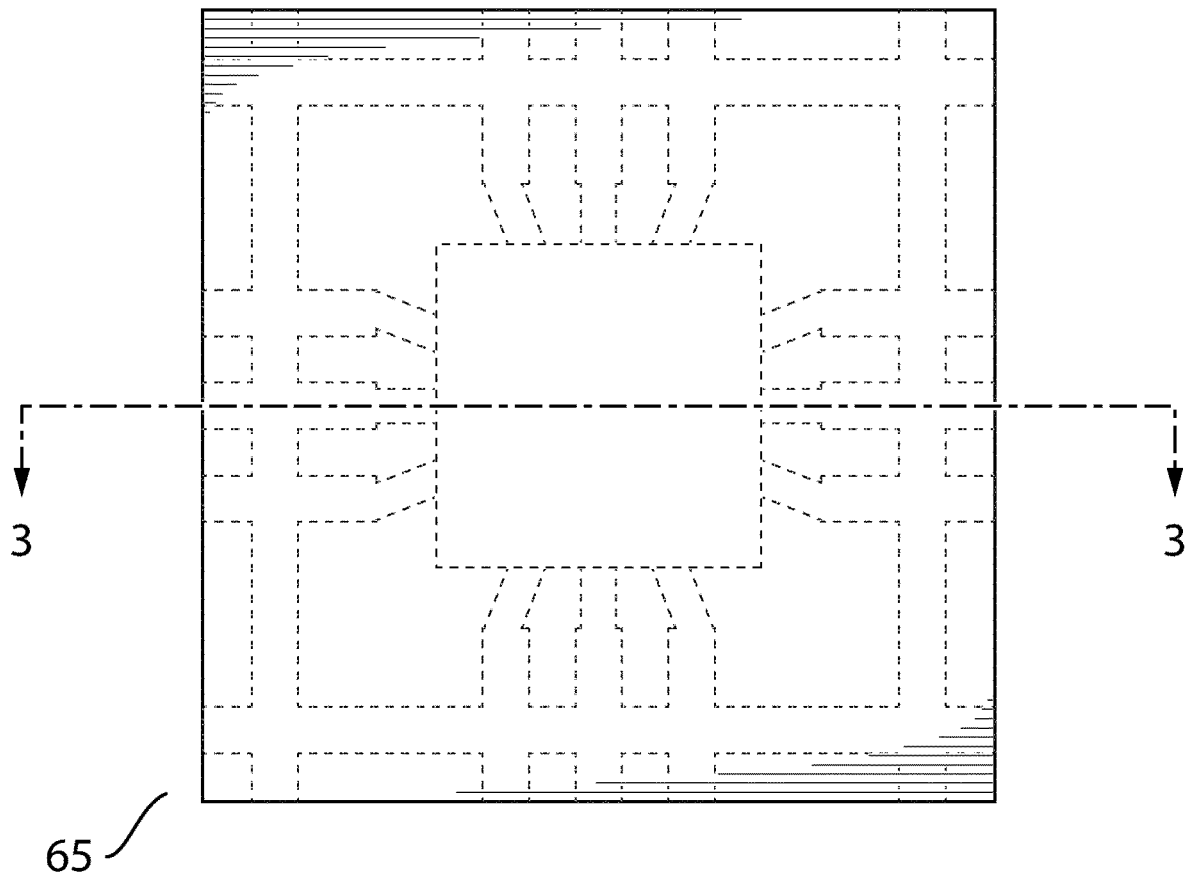
FIG. 3A is a top perspective view of lead frame with an encapsulation layer in accordance with a prior art embodiment.
Figure 3B:
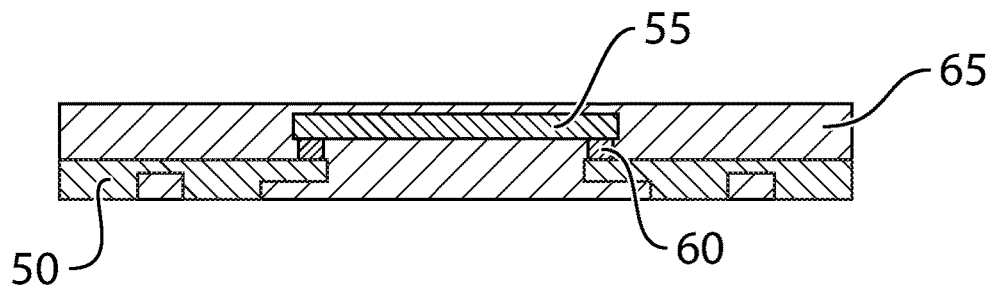
FIG. 3B is a cross sectional view of the prior art lead frame in accordance with the embodiment of FIG. 3A through the line 3-3.
Figure 4A:
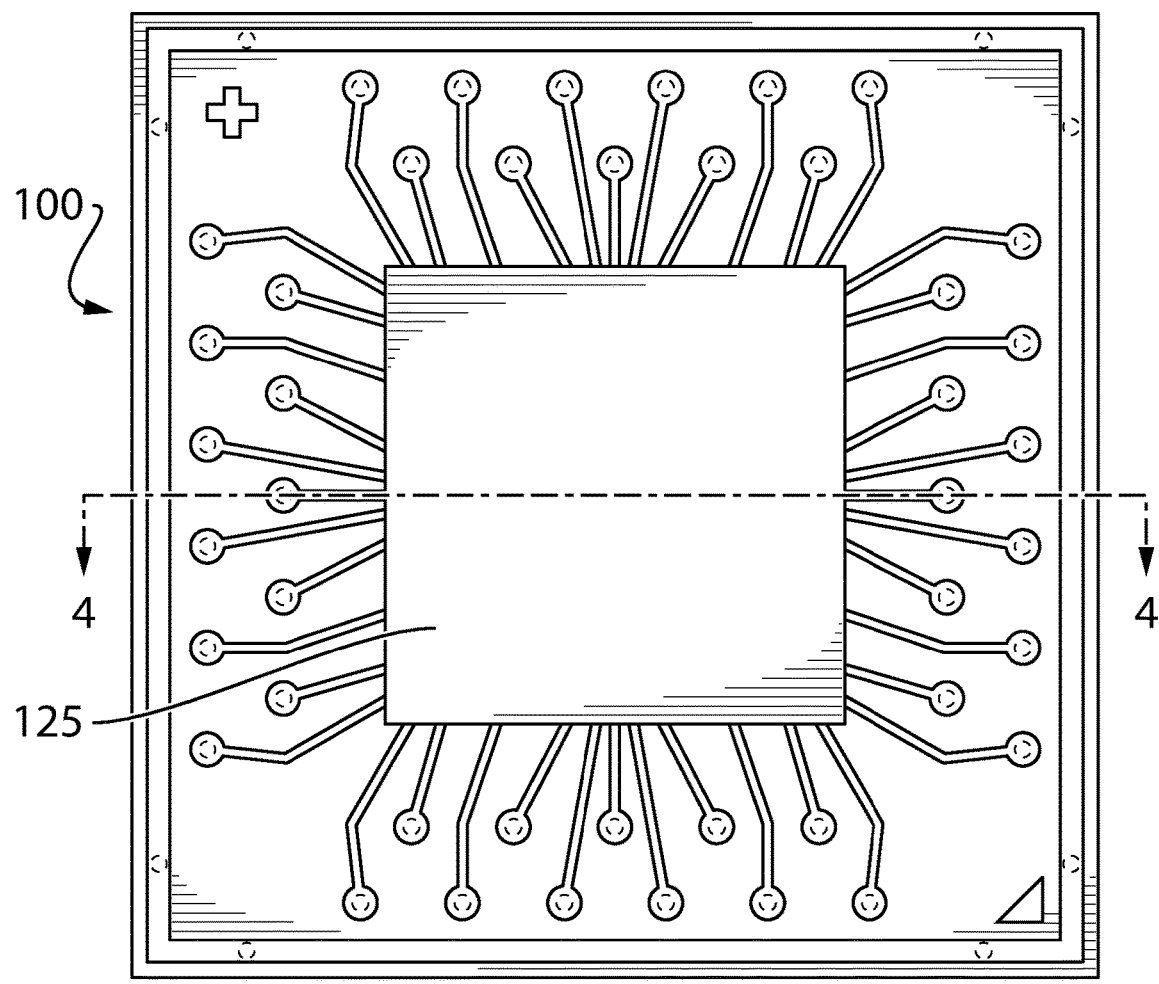
FIG. 4A is a top perspective view of a semiconductor package in accordance with an embodiment.
Figure 4B:
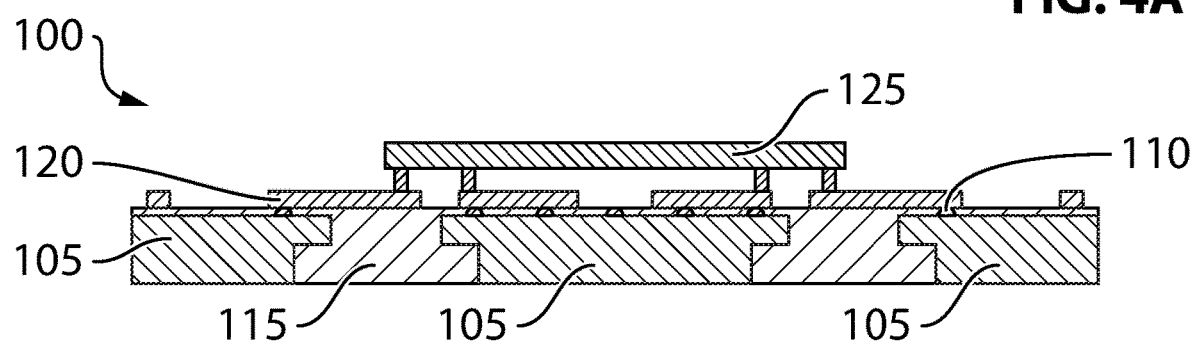
FIG. 4B is a cross sectional view of the semiconductor package embodiment of FIG. 4A through the line 4-4.

Referring to FIGS. 4A and 4B, a semiconductor package 100 is generally shown. It is to be understood that the semiconductor package 100 is purely exemplary and that it will become apparent to those skilled in the art that modifications to the semiconductor package 100 are contemplated. Examples of variations are discussed in greater detail below and various components can be substituted and/or added depending on the requirements of the semiconductor package 100. In the present embodiment, the semiconductor package 100 includes a lead frame 105, a plurality of conductive vias 110, molding material 115, metalized pattern 120, and a flip chip 125.

It is to be appreciated that the semiconductor package 100 is not particularly limited and can be include various semiconductor devices. For example, the semiconductor device can be an integrated circuit chip, a microelectromechanical system, or a passive component such as a capacitor, an inductor, or a resistor.

Figure 5:
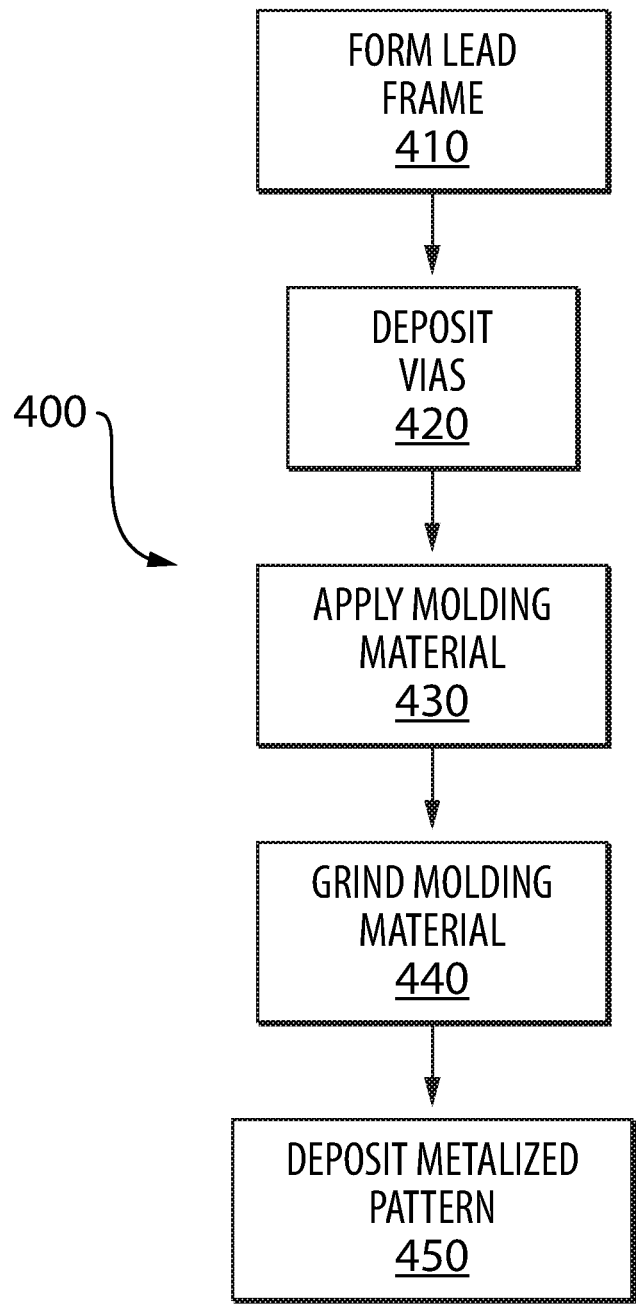
FIG. 5 is a flow chart of a method of manufacturing in accordance with an embodiment.

Referring to FIG. 5, a method manufacturing a carrier is represented in the form of a flow-chart and indicated generally at 400. For illustrative purposes, it can be assumed the method 400 is implemented to manufacture a carrier for production of the semiconductor package 100 described above. However, it is to be understood that the method 400 is not limited to the manufacture a carrier for production of the semiconductor package 100 and can be implemented to manufacture a carrier for production of other devices that are assembled using a flip chip connection. Furthermore, the following discussion of the method 400 will lead to further understanding of the method manufacture of a carrier for production of the semiconductor package 100 and its various components. It is to be understood that the method 400 can be varied, and need not work exactly as discussed herein.

Beginning at block 410, a lead frame 105 is formed. In the present embodiment, the lead frame 105 is made of copper for its electrical and mechanical properties. It is to be appreciated by a person of skill in the art with the benefit of this description that the material of the lead frame 105 is not particularly limited and that any other material with suitable electrical and mechanical properties can be used. For example, in other embodiments, the lead frame 105 can be an iron/nickel alloy such as Alloy 42, aluminum, titanium, phosphor bronze, nickel, or other alloys.

The manner by which the lead frame 105 is formed is not particularly limited. For example, in the present embodiment, the lead frame 105 is formed using an etching process, such as using a photo etching process. In other embodiments, the lead frame 105 can also be formed using a mechanical stamping process. In further embodiments, it is to be appreciated by a person of skill in the art that the lead frame 105 can be obtained from an external manufacturer. Accordingly, in such embodiments, forming the lead frame 105 may not be a necessary step of the process as the lead frame 105 can be sourced from an external supplier specializing in lead frame manufacturing.

Figure 6:
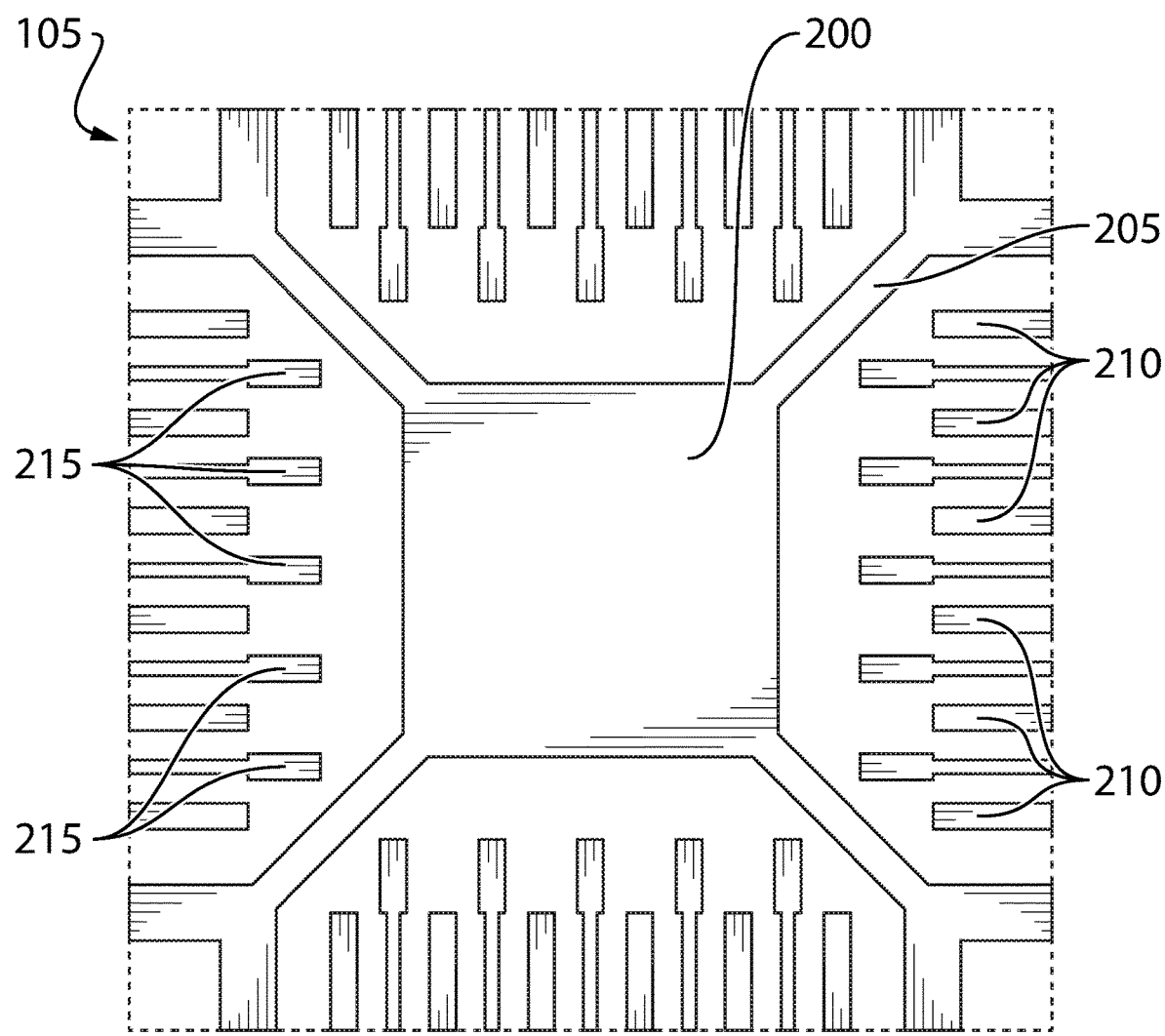
FIG. 6 is a top perspective view of a lead frame in accordance with an embodiment.

Referring to FIG. 6, a lead frame 105 formed in accordance with the process described in block 410 is shown. In the present embodiment, the lead frame 105 includes a die attach pad 200 connected to die attach pad tie-bars 205. In addition, the lead frame 105 includes outer leads 210 and inner leads 215. It is to be appreciated that the lead frame 105 is not particularly limited and that the design can be modified with other designs. For example, in the present embodiment, there is a dual row structure that includes 24 outer leads 210 and 20 inner leads 215. In other embodiments, the number of outer leads 210 and inner leads 215 can be increased and/or decreased. In further embodiments, the lead frame 105 can have more than two rows of leads or the leads can be lined up in another manner, such as not in a square shape.

Figure 7A:
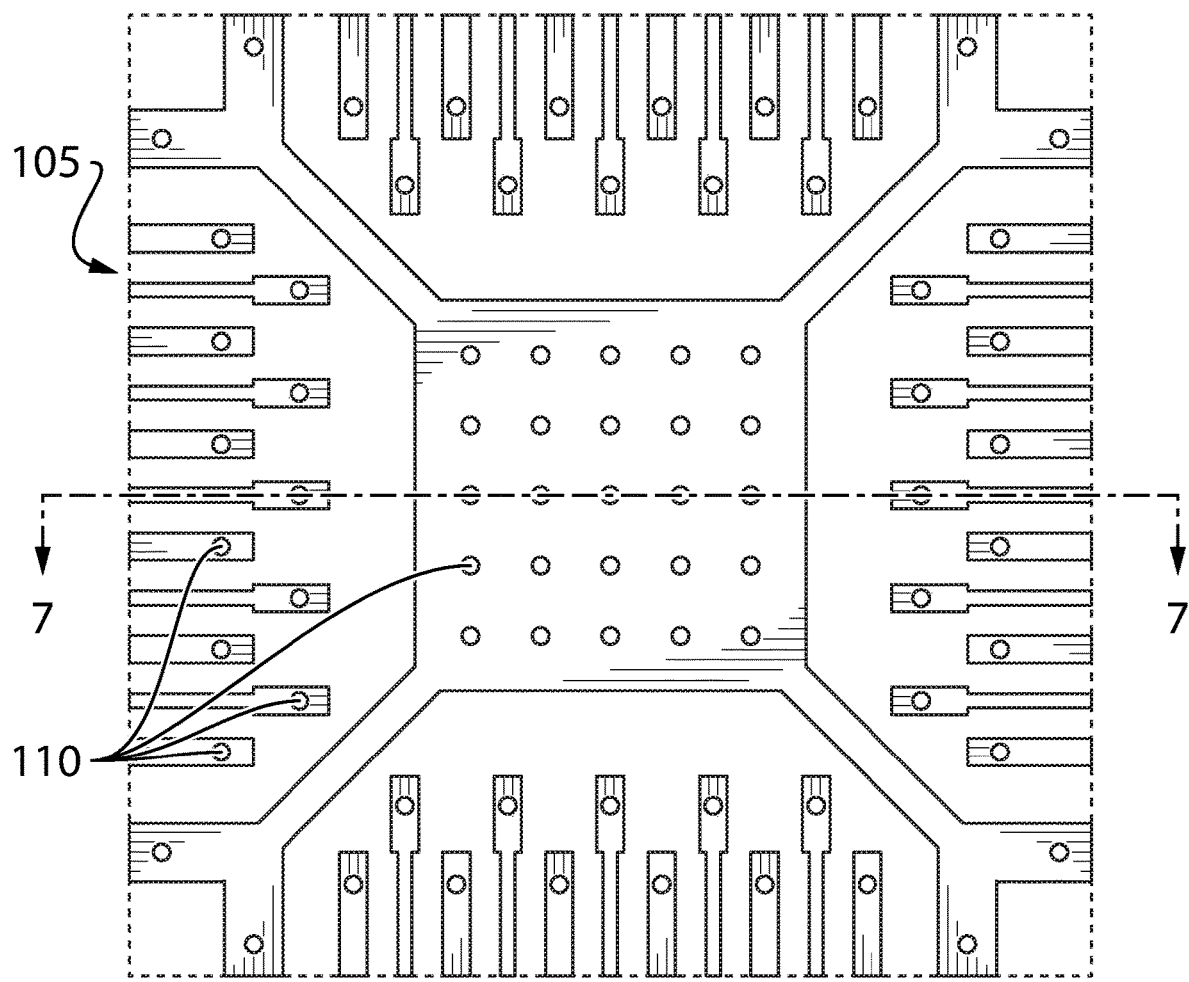
FIG. 7A is a top perspective view of a lead frame with conductive vias in accordance with the embodiment.
Figure 7B:
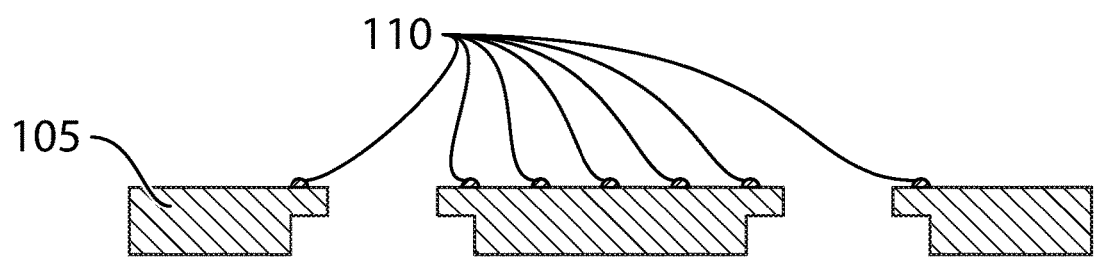
FIG. 7B is a cross sectional view of the lead frame in accordance with the embodiment of FIG. 7A through the line 7-7.

Block 420 involves depositing a plurality of conductive vias 110 on the top surface of the lead frame 105 as shown in FIGS. 7A and 7B. The conductive vias 110 are not particularly limited and can be formed using any conductive material capable of providing conductivity across an insulating layer of molding material discussed in greater detail below. In the present embodiment, the conductive vias are formed from a silver epoxy by printing or dispensing. In other embodiments, the silver epoxy can be replaced with another conductive epoxy or material. In further embodiments, the conductive vias 110 can be printed solder followed by a reflow process to bond the solder to the lead frame 105. Other embodiments can use stud wires or posts formed from gold or copper as the conductive vias 110.

Next, block 430 involves applying a molding material 115 over the lead frame 105 and conductive vias 110. In the present embodiment, the molding material 115 is applied to cover the top surface of the lead frame 105 and completely cover the conductive vias 110 while leaving the bottom surface of the lead from exposed. The molding material 115 used is not particularly limited and can be selected from a variety of materials that can be readily applied over the lead frame 105 and can subsequently harden to form an insulating layer. In the present embodiment, the molding material 115 is an epoxy molding compound that includes a resin and filler which can typically applied by transfer molding or compression molding. In other embodiments, the molding material 115 can be replaces with another insulating layer.

Block 440 comprises grinding the molding material 115 after hardening to expose the tops of the conductive vias 110. The manner by which the molding material is grinded is not particularly limited and can include a wide variety of methods. For example, the grinding can be carried our using a mechanical grinding wheel.

Figure 8A:
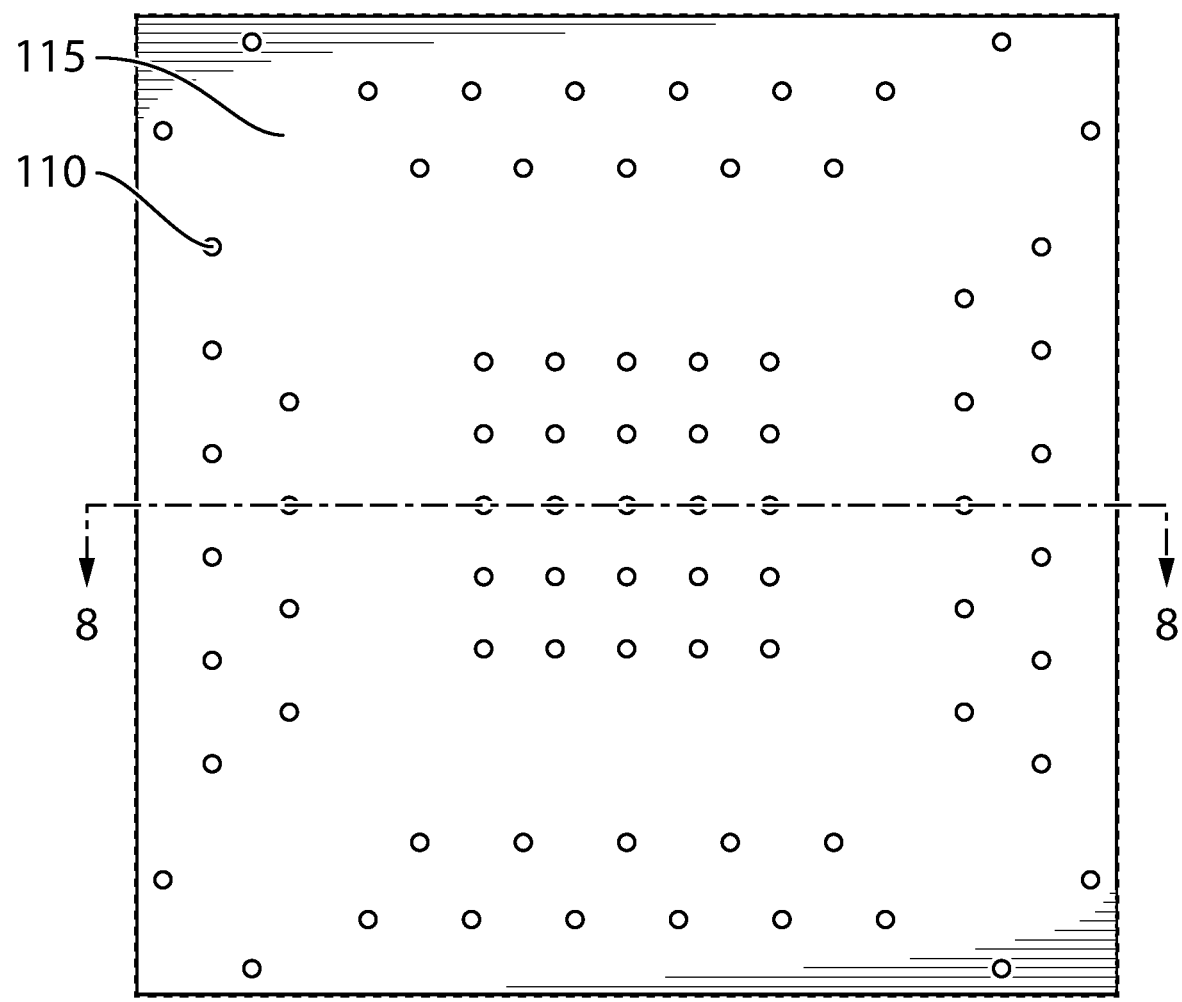
FIG. 8A is a top perspective view of the lead frame shown in FIG. 7A with molding material in accordance with an embodiment.
Figure 8B:
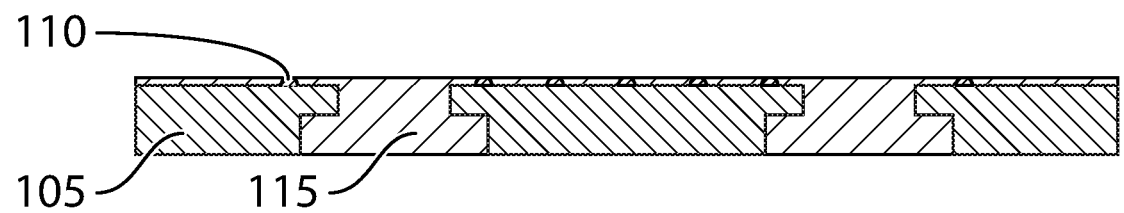
FIG. 8B is a cross sectional view of the lead frame in accordance with the embodiment of FIG. 8A through the line 8-8.

Referring to FIGS. 8A and 8B, the result of grinding the molding material 115 in accordance with the process described by block 440 is shown. It is to be appreciated that by grinding away the molding material 115, the potions of the conductive vias 110 extending through the molding material 115 form a pattern of connection points which lead to various leads on the lead frame 105. The exposed conductive vias 110 also provide access to the die attach pad 200 and the tie bars 205. Furthermore, as shown in FIG. 8B, the grinding process also grinds the tops of the conductive vias 110 such that a flat surface is provided for further processing.

Figure 9A:
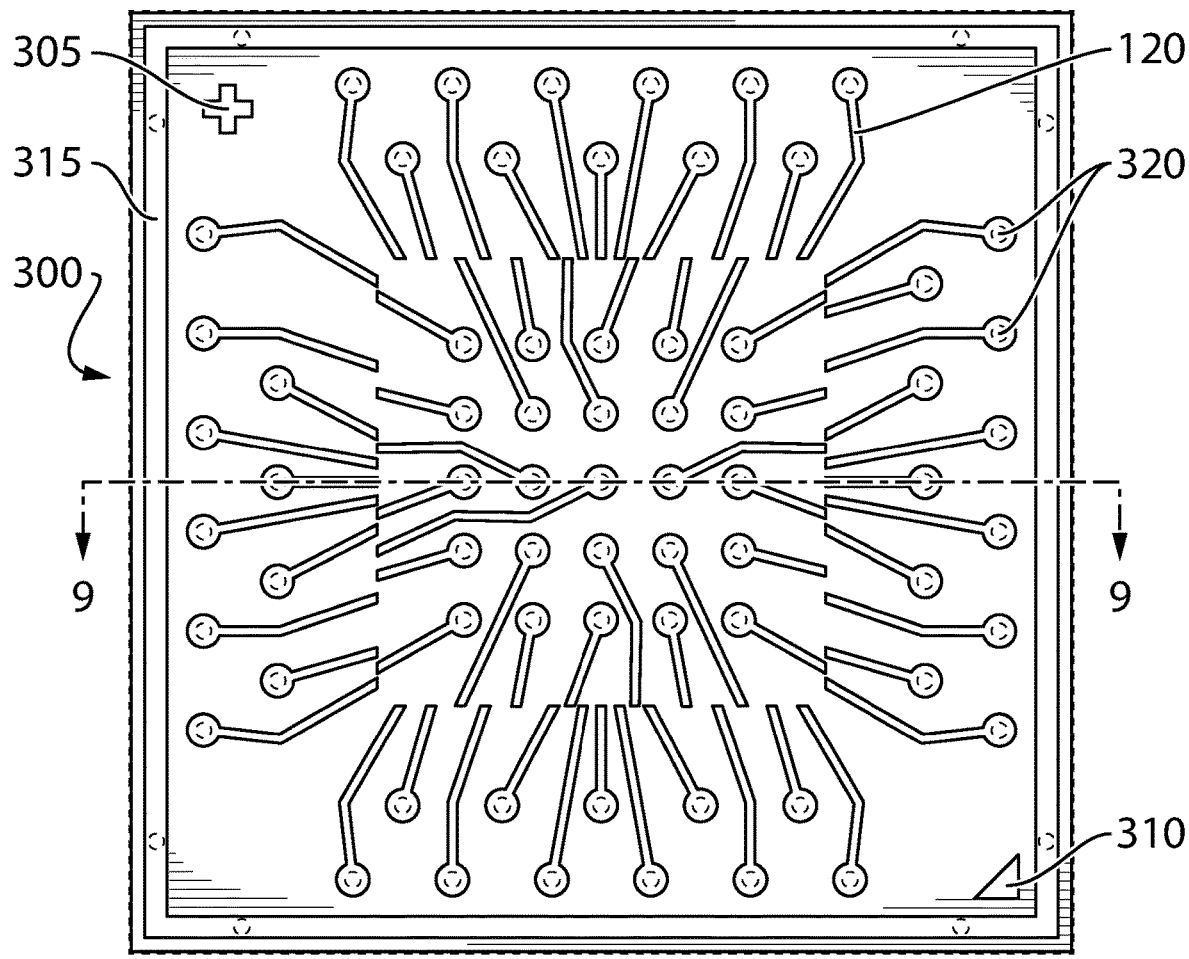
FIG. 9A is a top perspective view of the lead frame shown in FIG. 8A with a metalized pattern.
Figure 9B:
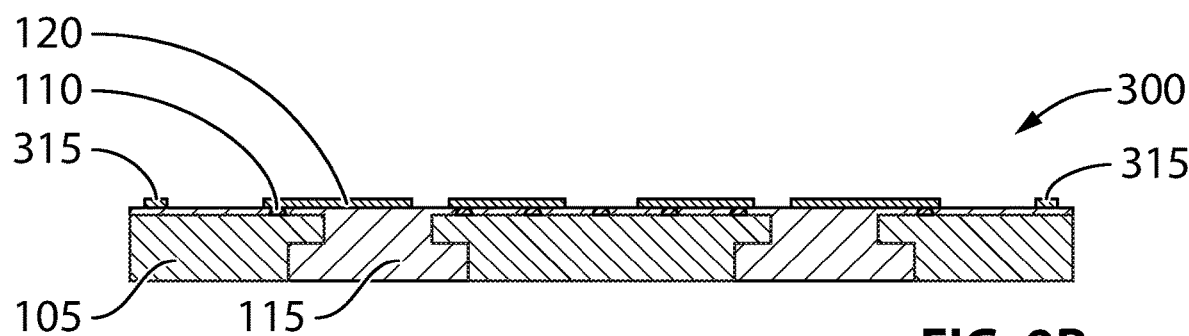
FIG. 9B is a cross sectional view of the lead frame in accordance with the embodiment of FIG. 9A through the line 9-9.

Block 450 involves depositing a metalized pattern 120 over the conductive vias 110 such that portions of the metalized pattern 120 are in contact and electrical communication with the conductive vias 110 to form a carrier 300 as shown in FIGS. 9A and 9B. The manner by which the metalized pattern 120 is deposited is not particularly limited. For example, in some embodiments, the metalized pattern 120 can be deposited using known deposition techniques such as a vapor deposition process. It is also to be appreciated by a person of skill in the art with the benefit of this description that the material of the metalized pattern 120 is not particularly limited. For example, the metalized pattern 120 can copper, nickel, palladium, silver, or gold plating.

Referring to FIG. 9, the carrier 300 includes a fiducial mark 305 for aligning the flip chip 125 during the final assembly step of the semiconductor package 100. The position or shape of the fiducial mark 305 is not particularly limited and can include a wide variety of shapes and positions. In the present embodiment, the fiducial mark 305 is a cross located on a corner. An additional fiducial mark 310 can be located at another corner of the carrier 300. As shown, the fiducial mark 310 is a different shape; however, it is to be understood by a person of skill in the art with the benefit of this description that the fiducial mark 310 can be the same shape as the fiducial mark 305. Furthermore, the carrier 300 can include a ring 315 for connecting the tie bar 205. In the present embodiment, it is to be appreciated that the ring 315 can be used to provide an additional ground path to the die attach pad 200 through the tie bar 205. The ring 315 is not particularly limited and it is to be appreciated by a person of skill in the art that it can be used to attach a conductive lid, such as a metal lid (not shown) to provide shielding for the flip chip 125. Although the present embodiment shows pads 320 deposited over each conductive via 110, it is to be appreciated that the pads 320 are optional and can be omitted where the metalized pattern can accurately contact each of the conductive vias 110.

Figure 10:
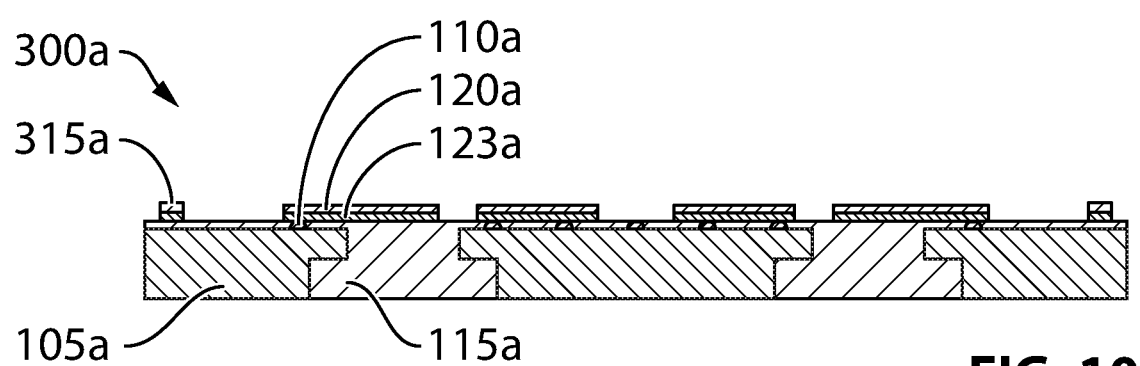
FIG. 10 is a cross sectional view of a lead frame in accordance with another embodiment.

Referring to FIG. 10, another embodiment of a carrier is generally shown as 300a in a cross section. In the present embodiment, like components of the carrier 300a bear like reference to their counterparts in the carrier 300, except followed by the suffix "a". In the present embodiment, the carrier 300a includes a lead frame 105a, conductive vias 110a, a molding material 115a, and a metalized pattern 120a having a ring 315a.

In the present embodiment. the carrier 300a further includes a seed layer 123a deposited on the molding material 155a prior to the deposition of the metalized pattern 120a. The seed layer 123a is deposited over the entire surface in a uniform layer using deposition techniques such as electroless plating and physical vapor deposition. The metalized pattern 120a can then be deposited directly on top of the seed layer 123a. It is to be appreciated by a person of skill in the art that the seed layer 123a improves adhesion of the metalized pattern 120a on the molding material 115a. It is to be appreciated by a person of skill in the art with the benefit of this description that the seed layer 123a is generally thin, for example, less than about 2 μm to also improve conductivity between the metalized pattern 120a and the vias 110a. The material of the seed layer 123a is not particularly limited and can include a variety of conductive materials. For example, in the present embodiment, the seed layer 123a is copper; however, in other embodiments, the seed layer 123a can be titanium, vanadium, nickel, or any combination of the above metals.

With the metalized pattern 120a deposited over the seed layer 123a, the exposed portions of the seed layer 123a can be etched away to electrically isolate portions of the metalized pattern 120a. For example, a selective etch can be used to etch away the exposed seed layer 123a while leaving the metalized pattern 120a intact. Accordingly, this effectively uses the metalized pattern 120a as a mask when possible. In other embodiments, such as when a selective etch is not possible, an appropriate mask can be deposited substantially over the metalized pattern 120a prior to etching away the exposed seed layer 123a. Alternatively, a universal etch can also be used since the metalized pattern 120a is thicker than the seed layer 123a, such the total removal of the seed layer 123a would result in a small amount of the metalized pattern 120a being removed.

It is to be appreciated that a flip chip 125 can be attached to the carrier 300 or the carrier 300a as shown in FIGS. 4A and 4B to form the semiconductor package 100. The manner by which the flip chip 125 is connected to the carrier is not particularly limited. For example, a mass reflow flip chip process, a thermal compression flip chip process, or a thermosonic flip chip process can be used.

Figure 11:
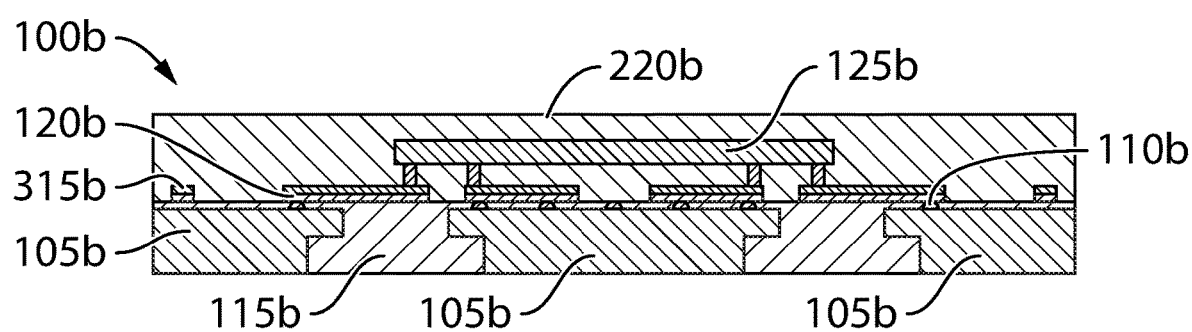
FIG. 11 is a cross sectional view of a lead frame in accordance with another embodiment.

Referring to FIG. 11, another embodiment of a semiconductor package is generally shown as 100b in a cross section. In the present embodiment, like components of the semiconductor package 100b bear like reference to their counterparts in the semiconductor package 100, except followed by the suffix "b". the present embodiment, the semiconductor package 100b includes a lead frame 105b, a plurality of conductive vias 110b, molding material 115b, metalized pattern 120b, and a flip chip 125b. Furthermore, after the flip chip 125b is connected, an encapsulation layer 220b can be applied over the entire structure to protect the semiconductor package 100b.

Various advantages will now be apparent to a person of skill in the art. Of note is the ability generate carriers with a multiple lead structure using an additive process allowing a metalized pattern that can be much narrower than the manufacturing capabilities of lead frames. This allows chips, with more contacts to be used on the carrier.

While specific embodiments have been described and illustrated, such embodiments should be considered illustrative only and should not serve to limit the accompanying claims.

What is claimed is:

1. A method of manufacturing a carrier, the method comprising:
   depositing a plurality of conductive vias on a top surface of a lead frame;
   applying a molding material over the lead frame, wherein the molding material covers the top surface of the lead frame and the plurality of conductive vias, and wherein the molding material exposes a bottom surface of the lead frame;
   grinding the molding material to expose the plurality of conductive vias; and
   depositing a metalized pattern over the molding material, wherein the metalized pattern is in electrical communication with the plurality of conductive vias; wherein the lead frame comprises a die attach pad, and the die attach pad is connected to a tie bar;
   the metalized pattern includes a ring to provide an additional ground path to the die attach pad; and
   the method further comprises:
   attaching a conductive lid to the ring to provide shielding.

2. The method of claim 1, further comprising etching the lead frame with dual rows of leads.

3. The method of claim 1, further comprising depositing a seed layer on the molding material prior to depositing the metalized pattern.

4. The method of claim 3, further comprising etching the seed layer.

5. The method of claim 4, wherein etching the seed layer comprises using the metalized pattern as a mask.

6. The method of claim 1, further comprising depositing a fiducial mark for aligning a chip.

7. The method of claim 6, further comprising attaching a chip to the carrier using the fiducial mark.

8. The method of claim 7, further comprising applying an encapsulation polymer to protect the flip chip.

* * * * *